United States Patent
Lu et al.

(10) Patent No.: US 9,865,593 B1
(45) Date of Patent: Jan. 9, 2018

(54) SEMICONDUCTOR DEVICE AND FABRICATION METHOD THEREOF

(71) Applicant: UNITED MICROELECTRONICS CORP., Hsin-Chu (TW)

(72) Inventors: Chia-Lin Lu, Taoyuan (TW); Chun-Lung Chen, Tainan (TW); Kun-Yuan Liao, Hsin-Chu (TW); Hsiang-Hung Peng, Hsinchu County (TW); Wei-Hao Huang, New Taipei (TW); Ching-Wen Hung, Tainan (TW); Chih-Sen Huang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/402,245

(22) Filed: Jan. 10, 2017

(30) Foreign Application Priority Data

Dec. 12, 2016 (TW) .............................. 105141092 A

(51) Int. Cl.
| | |
|---|---|
| *H01L 27/06* | (2006.01) |
| *H01L 21/8234* | (2006.01) |
| *H01L 21/768* | (2006.01) |
| *H01L 49/02* | (2006.01) |

(52) U.S. Cl.
CPC .... *H01L 27/0629* (2013.01); *H01L 21/76805* (2013.01); *H01L 21/76816* (2013.01); *H01L 21/76895* (2013.01); *H01L 21/823431* (2013.01); *H01L 21/823475* (2013.01); *H01L 28/20* (2013.01); *H01L 28/24* (2013.01)

(58) Field of Classification Search
CPC .................................................. H01L 27/0629
See application file for complete search history.

(56) References Cited

U.S. PATENT DOCUMENTS

| | | | |
|---|---|---|---|
| 6,069,398 A | 5/2000 | Kadosh | |
| 6,410,422 B1 | 6/2002 | Sun | |
| 8,859,386 B2 * | 10/2014 | Lu | H01L 28/24 257/350 |
| 9,111,768 B2 * | 8/2015 | Lu | H01L 28/24 |
| 9,401,358 B1 * | 7/2016 | Hung | H01L 27/0629 |
| 9,412,693 B2 * | 8/2016 | Kim | H01L 23/5256 |
| 2013/0328131 A1 * | 12/2013 | Lu | H01L 28/24 257/379 |
| 2014/0332871 A1 * | 11/2014 | Kim | H01L 23/5256 257/296 |
| 2016/0204103 A1 * | 7/2016 | Hung | H01L 27/0629 257/536 |

* cited by examiner

*Primary Examiner* — Robert Bachner
*Assistant Examiner* — Molly Reida
(74) *Attorney, Agent, or Firm* — Winston Hsu

(57) ABSTRACT

A method for fabricating semiconductor device is disclosed. A substrate having a first transistor on a first region, a second transistor on a second region, a trench isolation region, a resistor-forming region is provided. A first ILD layer covers the first region, the second region, and the resistor-forming region. A resistor material layer and a capping layer are formed over the first region, the second region, and the resistor-forming region. The capping layer and the resistor material layer are patterned to form a first hard mask pattern above the first and second regions and a second hard mask pattern above the resistor-forming region. The resistor material layer is isotropically etched. A second ILD layer is formed over the substrate. The second ILD layer and the first ILD layer are patterned with a mask and the first hard mask pattern to form a contact opening.

21 Claims, 10 Drawing Sheets

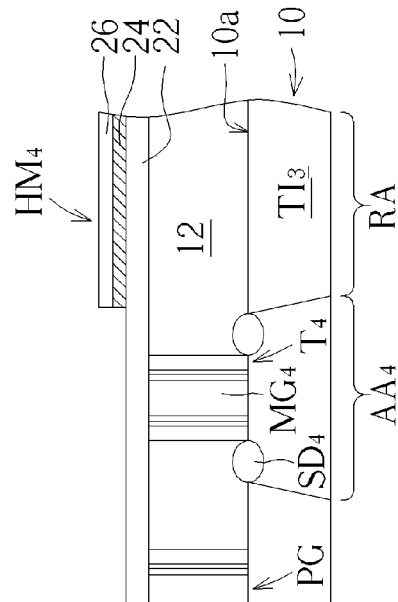
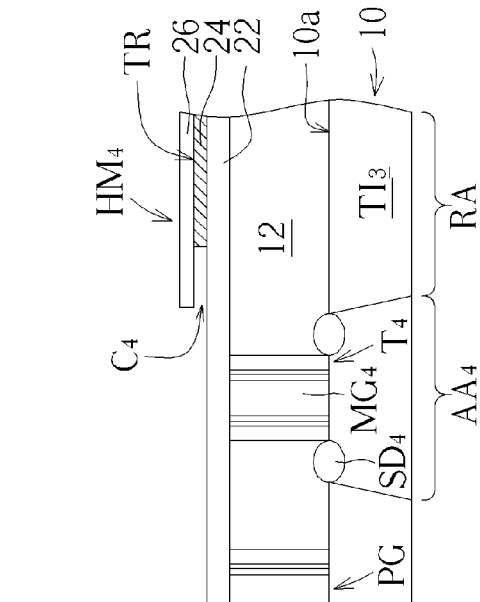
FIG. 3
FIG. 4

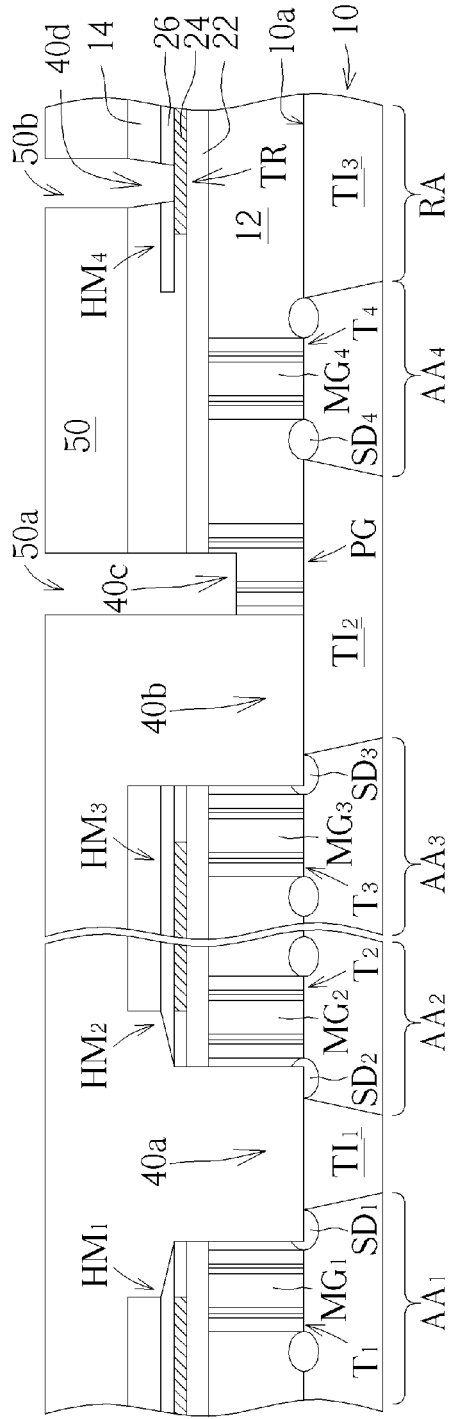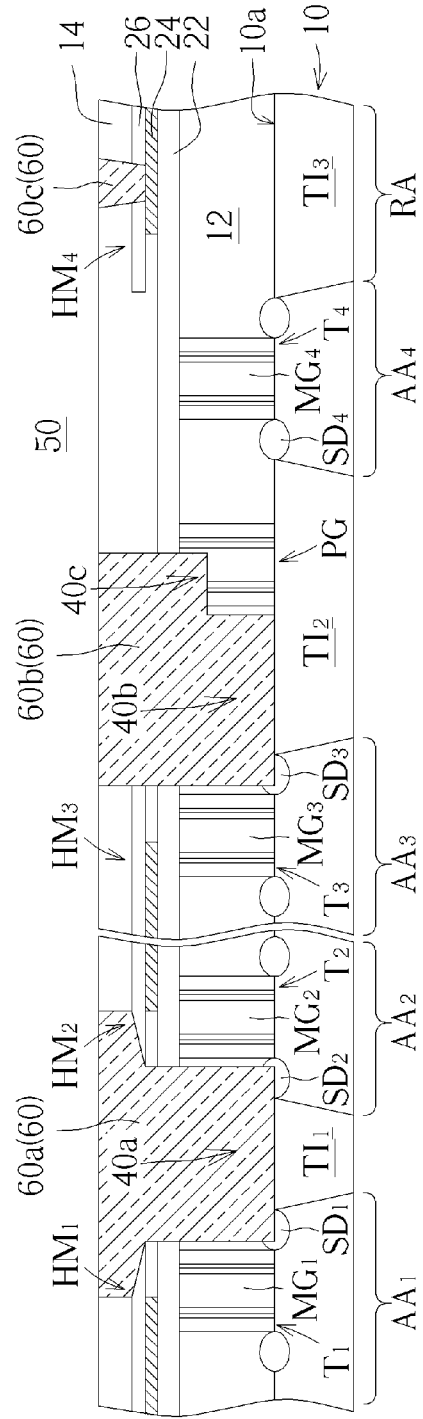
FIG. 7
FIG. 8

SEMICONDUCTOR DEVICE AND FABRICATION METHOD THEREOF

BACKGROUND OF THE INVENTION

1. Field of the Invention

The present invention relates generally to a method for fabricating a semiconductor device. More particularly, the present invention relates to a method of integrating thin film resistor processes to fabricate low-resistance local interconnect contact.

2. Description of the Prior Art

As semiconductor integrated circuit technology continues to improve, semiconductor chips have smaller and more complex circuit designs. At the same time, the number and density of functional devices in each chip region is increasing due to innovation requirements.

A standard semiconductor chip includes a plurality of semiconductor electronic components, such as transistors interconnected by an interconnection scheme to form a complete functional circuit. Since the dimensions of the above-mentioned semiconductor electronic components have become smaller in recent years, the contact holes may not align with the underneath conductive area such as the gate or the source/drain regions, resulting in increased contact resistance thereby affecting device performance.

SUMMARY OF THE INVENTION

According to one embodiment, the present invention provides a method for fabricating a semiconductor device. First, a substrate having a first transistor in a first region, a second transistor in a second region, a trench isolation region isolating the first region from the second region, a resistor-forming region, and a first interlayer dielectric (ILD) layer over the first region, the second region, and the resistor-forming region is provided. The first transistor comprises a first terminal selected from the group consisting of a first gate and a first source/drain region, and the second transistor comprises a second terminal selected from the group consisting of a second gate and a second source/drain region. Next, a resistor material layer and a capping layer are formed over the first region, the second region, and the resistor-forming region. The capping layer and the resistor material layer are patterned to form a first hard mask pattern above the first region and the second region, and form a second hard mask pattern above the resistor-forming region. Next, isotropic etching is performed on the resistor material layer. A second interlayer dielectric (ILD) layer is deposited over the substrate. Finally, the second ILD layer and the first ILD layer are patterned with a mask and the first hard mask pattern to form a contact opening. The contact opening exposes the first terminal, the second terminal, and the trench isolation region.

According to another embodiment, a method for fabricating a semiconductor device is provided. First, a substrate having a first transistor in a first region, a second transistor in a second region, a trench isolation region isolating the first region from the second region, a resistor-forming region, and a first interlayer dielectric (ILD) layer over the first region, the second region, and the resistor-forming region is provided. The first transistor comprises a first terminal selected from the group consisting of a first gate and a first source/drain region, and the second transistor comprises a second terminal selected from the group consisting of a second gate and a second source/drain region. Next, a resistor material layer and a capping layer are formed over the first region, the second region, and the resistor-forming region. The capping layer and the resistor material layer are patterned to form a hard mask pattern above the trench isolation region and a thin film resistor above the resistor-forming region. Next, a second interlayer dielectric (ILD) layer is deposited on the hard mask pattern and the thin film resistor. The second ILD layer and the first ILD layer are patterned with a mask and the hard mask pattern to form a first contact opening and a second contact opening. The first contact opening exposes the first source/drain region, and the second contact opening exposes the second source/drain region.

According to another embodiment, the present invention provides a semiconductor device, including: a substrate having a first transistor in a first region, a second transistor in a second region, a trench isolation region isolating the first region from the second region, and a resistor-forming region, wherein the first transistor includes a first terminal selected from the group consisting of a first gate and a first source/drain region, and the second transistor includes a second terminal selected from the group consisting of a second gate and a second source/drain region; a first interlayer dielectric (ILD) layer over the first region, the second region, and the resistor-forming region; a thin film resistor over the resistor-forming region, the thin film resistor including a resistor material layer and a capping layer on the resistor material layer; a hard mask pattern over the first region and the second region, the hard mask layer including the resistor material layer; a second interlayer dielectric (ILD) layer covering the hard mask pattern, the thin film resistor, and the first ILD layer; a contact opening penetrating through the second ILD layer, the capping layer, the resistor material layer, and the first ILD layer to expose the first terminal and/or the second terminal; and a local interconnect contact disposed in the contact opening.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 8 are schematic, cross-sectional diagrams showing an exemplary method of fabricating a semiconductor transistor device in accordance with one embodiment of the invention.

DETAILED DESCRIPTION

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural, logical and electrical changes may be made without departing from the scope of the present invention. The following detailed description is, therefore, not to be taken in a limiting sense, and the scope of the present invention is defined only by the appended claims, along with the full scope of equivalents to which such claims are entitled.

Before describing the preferred embodiment, the following description will be given for specific terms used throughout the specification.

The term "etch" or "etching" is used herein to generally describe a fabrication process of patterning a material, such that at least a portion of the material remains after the etch is completed. For example, it should be understood that the process of etching silicon involves the steps of patterning a photoresist layer above the silicon with an exposure and development technique, and then removing the areas of silicon no longer protected by the photoresist layer. As such, the areas of silicon protected by the photoresist layer will remain behind after the etch process is complete. In another example, however, etching may also refer to a process that does not use a photoresist layer, but still leaves behind at least a portion of the material after the etching process is completed.

The above description serves to distinguish the term "etching" from "removing." When etching a material, at least a portion of the material remains behind after the process is completed. In contrast, when removing a material, substantially all of the material is removed in the process. In some embodiments, "removing" is considered to be a broad term that may incorporate etching. The term "patterning" typically includes lithography and etching processes.

The term "substrate," "semiconductor substrate" or "wafer" as described throughout, is most commonly a silicon substrate or a silicon wafer. The term "substrate" or "wafer" may also, however, refer to any semiconductor material such as germanium, gallium arsenide, indium phosphide, and the like.

Figure 1:
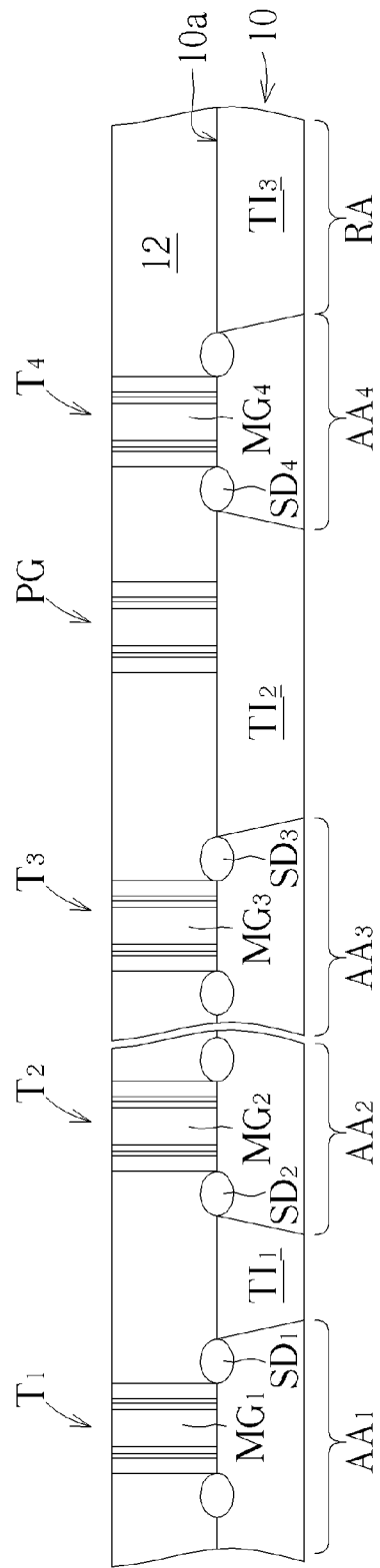

FIG. 1 to FIG. 8 are schematic, cross-sectional diagrams showing an exemplary method of fabricating a semiconductor transistor device in accordance with one embodiment of the invention. First, as shown in FIG. 1, a substrate 10 is provided, such as silicon substrate. According to the embodiment of the invention, the substrate 10 includes a plurality of active regions $AA_1$ to $AA_4$ and a resistor-forming region RA. A plurality of trench isolation regions $TI_1$ to $TI_3$ for isolating the plurality of active regions $AA_1$ to $AA_4$ are formed on the main surface 10a of the substrate 10, in which the trench isolation region $TI_1$ is provided between the active region $AA_1$ and the active region $AA_2$, the region $TI_2$ is provided between the active region $AA_3$ and the active region $AA_4$, and the resistor-forming region RA is provided directly above the trench isolation region $TI_3$.

According to the embodiment of the invention, a transistor $T_1$ is provided in the active region $AA_1$, a transistor $T_2$ is provided in the active region $AA_2$, a transistor $T_3$ is provided in the active region $AA_3$, and a transistor $T_4$ is provided in the active region $AA_4$. In addition, a passing gate PG is provided on the trench isolation region $TI_2$.

According to the embodiment of the invention, the transistor $T_1$ includes a gate structure $MG_1$ and a source/drain region $SD_1$, the transistor $T_2$ includes a gate structure $MG_2$ and a source/drain region $SD_2$, the transistor $T_3$ includes agate structure $MG_3$ and a source/drain region $SD_3$, and the transistor $T_4$ includes a gate structure $MG_4$ and a source/drain region $SD_4$. According to an embodiment of the present invention, an epitaxial layer such as SiP epitaxial layer, SiC epitaxial layer or SiGe epitaxial layer may be provided in each of the source/drain regions $SD_1$ to $SD_4$.

According to an embodiment of the present invention, a silicide layer may be provided in each of the source/drain regions $SD_1$ to $SD_4$.

According to an embodiment of the present invention, a sacrificial layer (not shown) may be selectively formed on each of the gate structures $MG_1$ to $MG_4$, but is not limited thereto. The spacers may be formed on the side walls of the gate structures $MG_1$ to $MG_4$. According to an embodiment of the present invention, the transistors $T_1$ to $T_4$ may be fin field effect transistors (FinFETs). The gate structures $MG_1$ to $MG_4$ may be formed by a replacement metal gate (RMG) process, but is not limited thereto.

According to an embodiment of the present invention, a first interlayer dielectric layer 12 is formed on the substrate 10 and covers the plurality of active regions $AA_1$ to $AA_4$ and the resistor-forming region RA. According to an embodiment of the present invention, the first interlayer dielectric layer 12 may include silicon oxide or a low dielectric constant material, but is not limited thereto.

FIG. 1 shows the structure of the first interlayer dielectric layer 12 after the planarization process, wherein the planarization process may be a chemical mechanical polishing process. According to an embodiment of the present invention, the first interlayer dielectric layer 12 is flush with the top surfaces of the gate structures $MG_1$ to $MG_4$.

Figure 2:
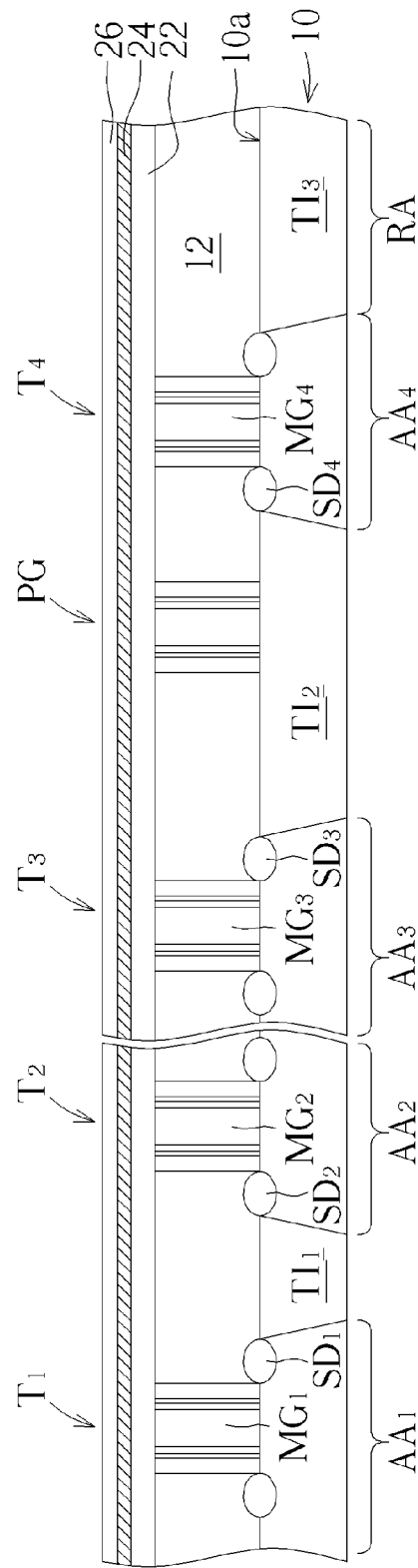

Next, as shown in FIG. 2, a dielectric buffer layer 22 is deposited, in a blanket manner, on the first interlayer dielectric layer 12. The dielectric buffer layer 22 is in direct contact with the first interlayer dielectric layer 12 and the exposed top surfaces of the gate structures $MG_1$ to $MG_4$. Next, a resistor material layer 24 is deposited, in a blanket manner, over the dielectric buffer layer 22, and a capping layer 26 is deposited, in a blanket manner, over the resistor material layer 24. According to the embodiment of the invention, the dielectric buffer layer 22 may include silicon oxide, etc. The resistive material layer 24 may include titanium nitride, tantalum nitride, chromium silicide, or nickel-chromium alloys, etc. The capping layer 26 may include silicon nitride, but is not limited thereto.

As shown in FIG. 3, a photolithography and etching process are performed to pattern the capping layer 26 and resistor material layer 24, thereby forming a hard mask pattern $HM_1$, a hard mask pattern $HM_2$, a hard mask pattern $HM_3$, and a hard mask pattern $HM_4$ above, respectively, the active region $AA_1$, the active region $AA_2$, the active region $AA_3$, and the resistor-forming region RA. According to the embodiment of the present invention, each of the hard mask patterns $HM_1$ to $HM_4$ includes a portion of the capping layer 26 and a portion of the resistor material layer 24. According to the embodiment of the present invention, the above-mentioned etching process may include an anisotropic dry etching process.

As shown in FIG. 4, an isotropic etching process such as a wet etching process is performed to isotropically etch the resistor material layer 24 of the hard mask patterns $HM_1$ to $HM_4$, so that the resistor material layer 24 of each of the hard mask patterns HM1 to HM4 are retracted inward to form respective undercut structures $C_1$ to $C_4$. According to the embodiment of the present invention, a thin film resistor TR is formed on the first interlayer dielectric layer 12 after completion of the isotropic etching process.

Figure 5:
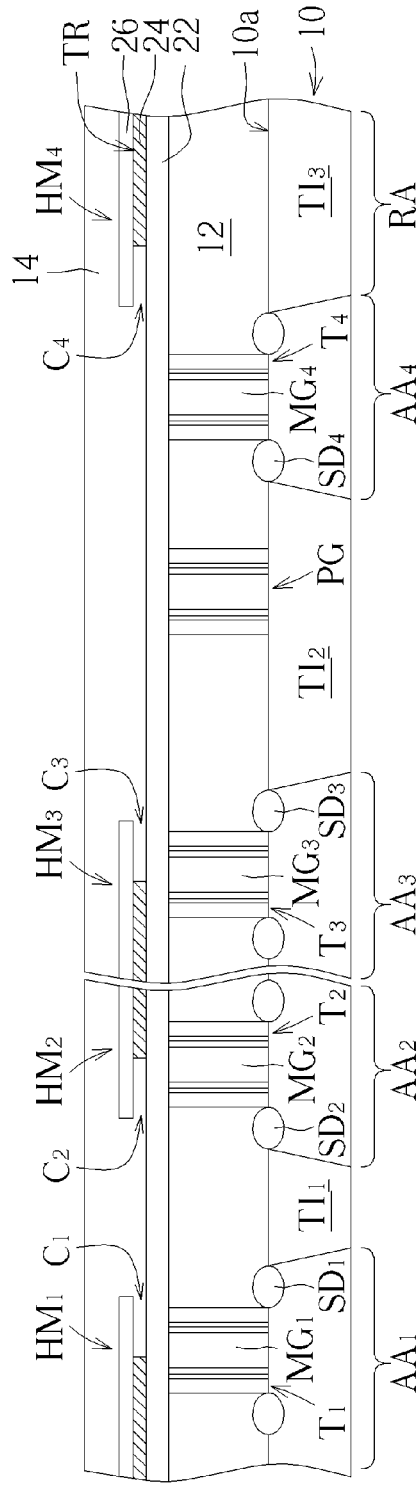

Next, as shown in FIG. 5, a second interlayer dielectric (ILD) layer 14 is deposited over the substrate 10. According to the embodiment of the present invention, the second interlayer dielectric layer 14 may include silicon oxide or a low dielectric constant material, but is not limited thereto. According to the embodiment of the present invention, the second interlayer dielectric layer 14 covers the capping layer 26 of each of the hard mask patterns $HM_1$ to $HM_4$, is in direct contact with and covers the dielectric buffer layer 22, and deposits into the undercut structures $C_1$ to $C_4$ of the hard mask patterns $HM_1$ to $HM_4$. According to the embodiment of the present invention, the second interlayer dielectric layer 14 is not indirect contact with the first interlayer dielectric layer 12.

Figure 6:
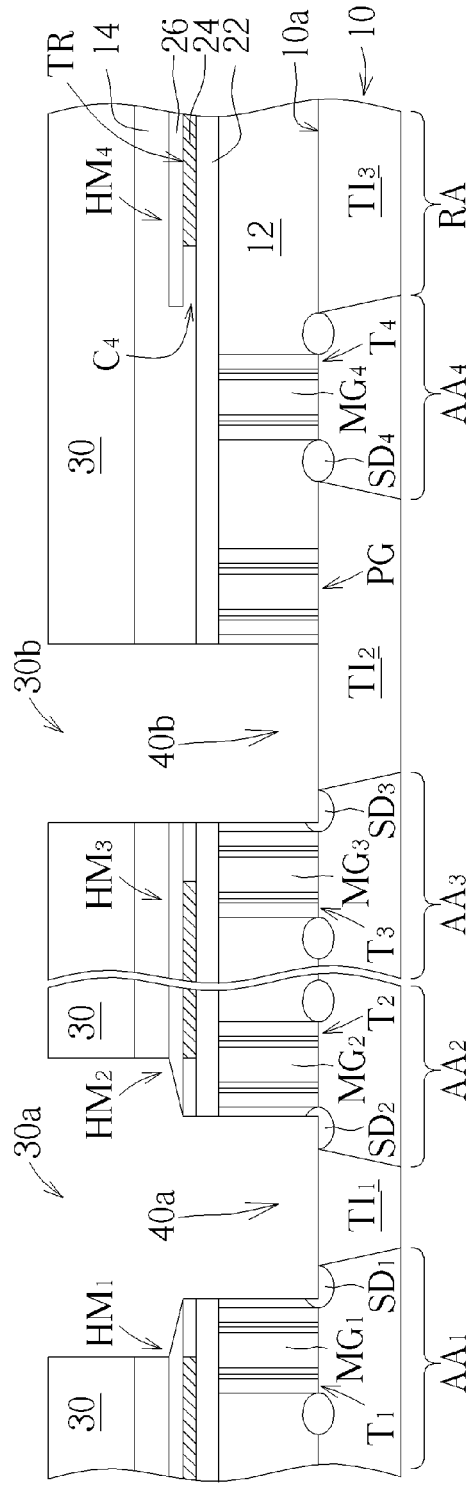

Next, as shown in FIG. 6, a photoresist pattern 30 having an opening 30a and an opening 30b is formed on the second interlayer dielectric layer 14. The opening 30a is located between the active region $AA_1$ and the active region $AA_2$ and overlaps with the trench isolation region $TI_1$. According to the embodiment of the present invention, the opening 30a may partially overlap with the active area $AA_1$ and the active area $AA_2$. The opening 30b is located between the active region $AA_3$ and the trench isolation region $TI_2$ and partially overlaps with the active region $AA_3$ and the trench isolation region $TI_2$.

An anisotropic dry etching process is performed by using the photoresist pattern 30 and the hard mask patterns $HM_1$ to $HM_3$ together as an etching resist mask to etch down the second interlayer dielectric layer 14, dielectric buffer layer 22 and the first interlayer dielectric layer 12 through the opening 30a and the opening 30b, thereby forming a contact opening 40a and a contact opening 40b. The contact opening 40a exposes the source/drain region $SD_1$ of the transistor $T_1$, the source/drain region $SD_2$ of the transistor $T_2$, and the trench isolation region $TI_1$ between the source/drain region $SD_1$ and the source/drain region $SD_2$. The contact opening 40b exposes the source/drain region $SD_3$ of the transistor $T_3$ and the trench isolation region $TI_2$. Subsequently, the photoresist layer 30 is removed.

As shown in FIG. 7, a photoresist pattern 50 having an opening 50a and an opening 50b is then formed on the substrate 10, wherein the opening 50a is located directly above the passing gate PG, and the opening 50b is located directly above the thin film resistor TR. Then, an anisotropic dry etching process is performed to etch down the second interlayer dielectric layer 14, the dielectric buffer layer 22 and the portion of the gate through the opening 50a, thereby forming a contact opening 40c that can communicate with the contact opening 40b. At the same time, the second interlayer dielectric layer 14 and the hard mask pattern $HM_4$ are etched down through the opening 50b to form a resistor contact opening 40d that exposes a terminal of the thin film resistor TR. According to the embodiment of the invention, the resistor contact opening 40d does not penetrate through the resistor material layer 24. Subsequently, the photoresist pattern 50 is removed.

As shown in FIG. 8, a conductive material layer 60, such as titanium nitride or tungsten, is deposited into the resistor contact opening 40d and the contact openings 40a, 40b and 40c. Next, a chemical mechanical polishing (CMP) process is performed to remove the conductive material layer 60 outside the resistor contact opening 40d and the contact openings 40a, 40b and 40c, thereby forming a resistor contact 60c in the resistor contact opening 40d, a local interconnect contact 60a in the contact opening 40a, and a local interconnect contact 60b in the contact openings 40b and 40c.

Figure 9:
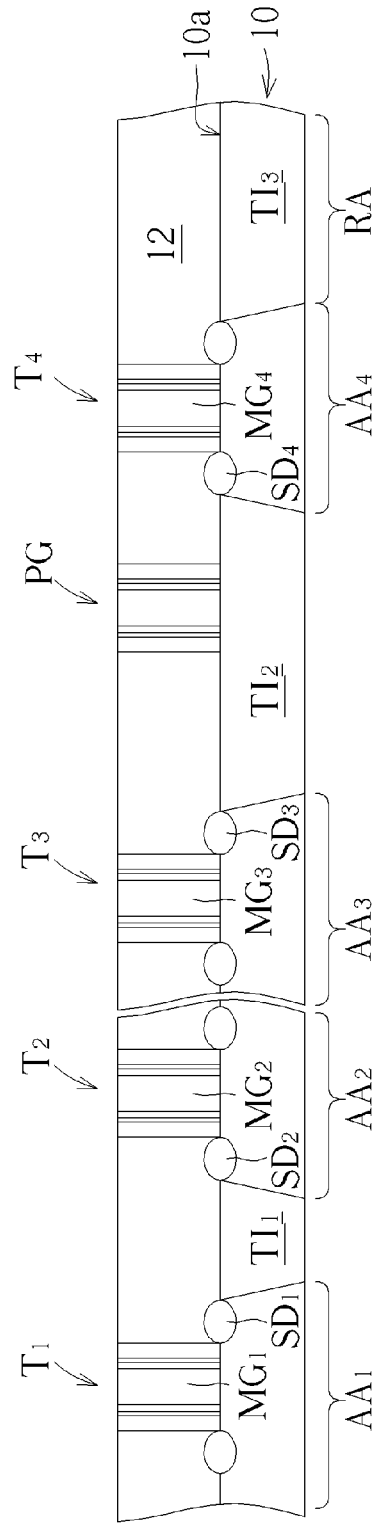
FIG. 9 to FIG. 18 are schematic, cross-sectional diagrams showing an exemplary method of fabricating a semiconductor transistor device in accordance with another embodiment of the invention.

FIG. 9 to FIG. 15 are schematic, cross-sectional diagrams showing an exemplary method of fabricating a semiconductor transistor device in accordance with another embodiment of the invention. First, as shown in FIG. 9, a substrate 10 is provided, such as silicon substrate. According to the embodiment of the invention, the substrate 10 includes a plurality of active regions $AA_1$ to $AA_4$ and a resistor-forming region RA. A plurality of trench isolation regions $TI_1$ to $TI_3$ for isolating a plurality of active regions $AA_1$ to $AA_4$ are formed on the main surface 10a of the substrate 10, in which the trench isolation region $TI_1$ is provided between the active region $AA_1$ and the active region $AA_2$, The region $TI_2$ is provided between the active region $AA_3$ and the active region $AA_4$, and the resistor-forming region RA is provided directly above the trench isolation region $TI_3$.

According to the embodiment of the invention, a transistor $T_1$ is provided in the active region $AA_1$, a transistor $T_2$ is provided in the active region $AA_2$, a transistor $T_3$ is provided in the active region $AA_3$, and a transistor $T_4$ is provided in the active region $AA_4$. In addition, a passing gate PG is provided on the trench isolation region $TI_2$.

According to the embodiment of the invention, the transistor $T_1$ includes a gate structure $MG_1$ and a source/drain region $SD_1$, the transistor $T_2$ includes a gate structure $MG_2$ and a source/drain region $SD_2$, the transistor $T_3$ includes a gate structure $MG_3$ and a source/drain region $SD_3$, and the transistor $T_4$ includes a gate structure $MG_4$ and a source/drain region $SD_4$. According to an embodiment of the present invention, an epitaxial layer such as an SiP epitaxial layer, SiC epitaxial layer or SiGe epitaxial layer may be provided in each of the source/drain regions $SD_1$ to $SD_4$. According to an embodiment of the present invention, a silicide layer may be provided in each of the source/drain regions $SD_1$ to $SD_4$.

According to an embodiment of the present invention, a sacrificial layer (not shown) may be selectively formed on each of the gate structures $MG_1$ to $MG_4$, but is not limited thereto. The spacers may be formed on the side walls of the gate structures $MG_1$ to $MG_4$. According to an embodiment of the present invention, the transistors $T_1$ to $T_4$ may be fin field effect transistors (FinFETs). The gate structures $MG_1$ to $MG_4$ may be formed by a replacement metal gate (RMG) process, but the process is not limited thereto.

According to an embodiment of the present invention, a first interlayer dielectric layer 12 is formed on the substrate 10 and covers the plurality of active regions $AA_1$ to $AA_4$ and the resistor-forming region RA. According to an embodiment of the present invention, the first interlayer dielectric layer 12 may include silicon oxide or a low dielectric constant material, but is not limited thereto.

FIG. 9 shows the structure of the first interlayer dielectric layer 12 after the planarization process, wherein the planarization process may be a chemical mechanical polishing process. According to an embodiment of the present invention, the first interlayer dielectric layer 12 is flush with the top surfaces of the gate structures $MG_1$ to $MG_4$.

Figure 10:
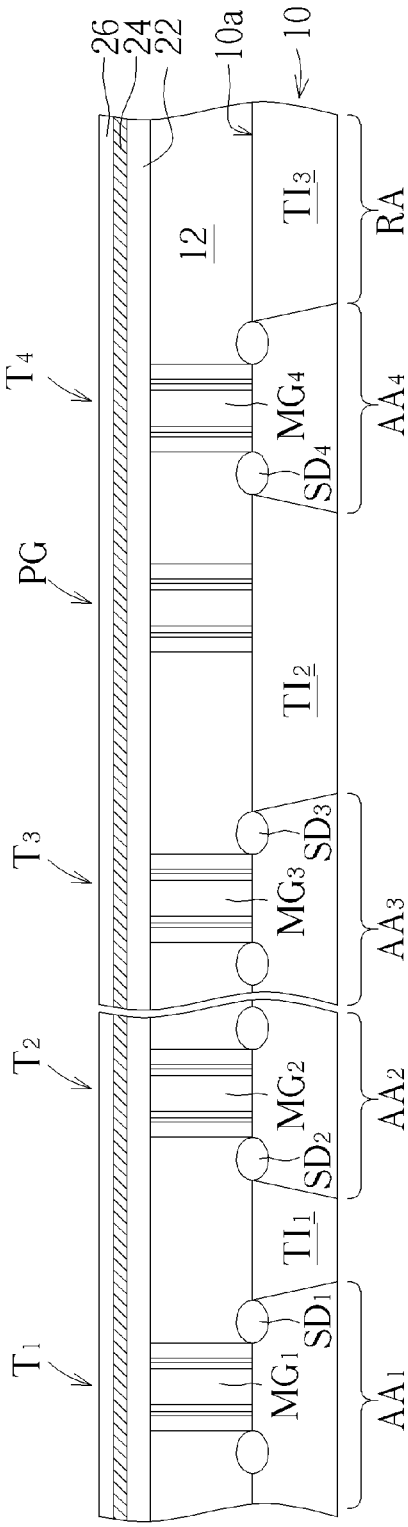

Next, as shown in FIG. 10, a dielectric buffer layer 22 is deposited, in a blanket manner, on the first interlayer dielectric layer 12. The dielectric buffer layer 22 is in direct contact with the first interlayer dielectric layer 12 and the top surfaces of the exposed gate structures $MG_1$ to $MG_4$. A resistor material layer 24 is deposited, in a blanket manner, over the dielectric buffer layer 22, and a capping layer 26 is deposited, in a blanket manner, over the resistor material layer 24. According to the embodiment of the invention, the dielectric buffer layer 22 may include silicon oxide, etc. The resistive material layer 24 may include titanium nitride, tantalum nitride, chromium silicide, or nickel-chromium alloys, etc. The capping layer 26 may include silicon nitride, but is not limited thereto.

Figure 11:
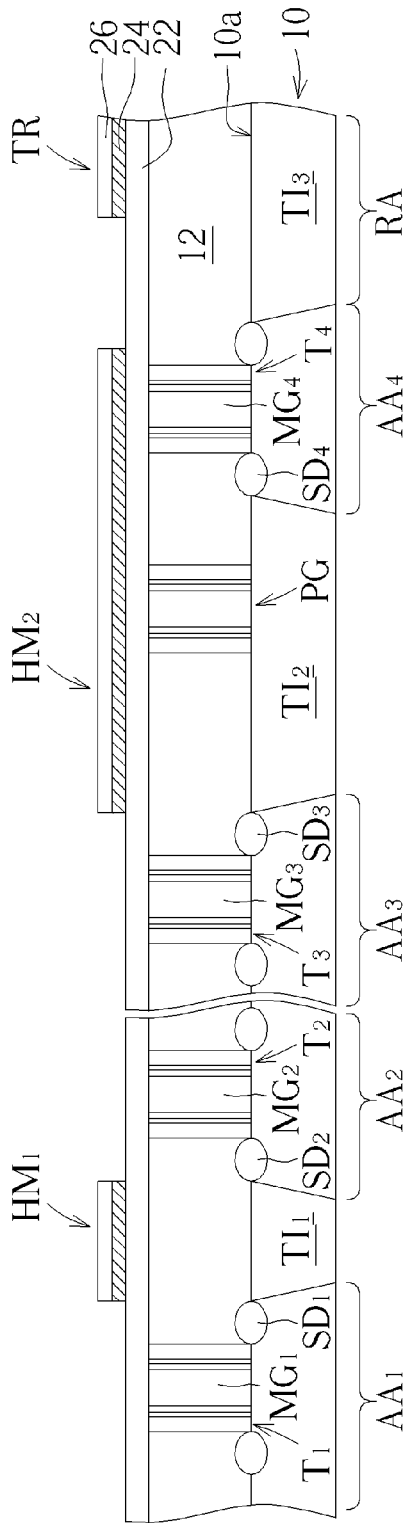

As shown in FIG. 11, a photolithography and etching process are performed to pattern the capping layer 26 and resistor material layer 24, thereby forming a hard mask pattern $HM_1$ above the trench isolation region $TI_1$, a hard mask pattern $HM_2$ above the trench isolation region $TI_2$ and the active region $AA_4$, and a thin film resistor TR above the resistor-forming region RA. According to the embodiment of the present invention, each of the hard mask patterns $HM_1$ to $HM_2$ includes a portion of the capping layer 26 and a portion of the resistor material layer 24. According to the embodiment of the present invention, the above-mentioned etching process may include an anisotropic dry etching process.

Figure 12:
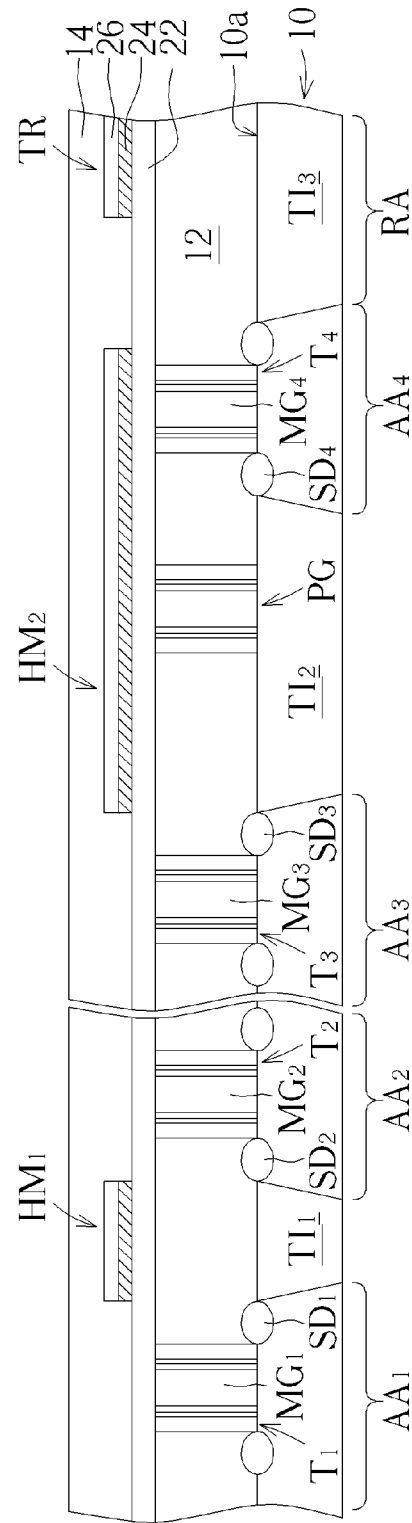

Next, as shown in FIG. 12, a second interlayer dielectric (ILD) layer 14 is deposited over the substrate 10. According to the embodiment of the present invention, the second interlayer dielectric layer 14 may include silicon oxide or a low dielectric constant material, but is not limited thereto. According to the embodiment of the present invention, the second interlayer dielectric layer 14 covers each of the hard mask patterns $HM_1$ to $HM_2$, is in direct contact with and covers the dielectric buffer layer 22, and covers the thin film resistor TR. According to the embodiment of the present invention, the second interlayer dielectric layer 14 is not in direct contact with the first interlayer dielectric layer 12.

Figure 13:
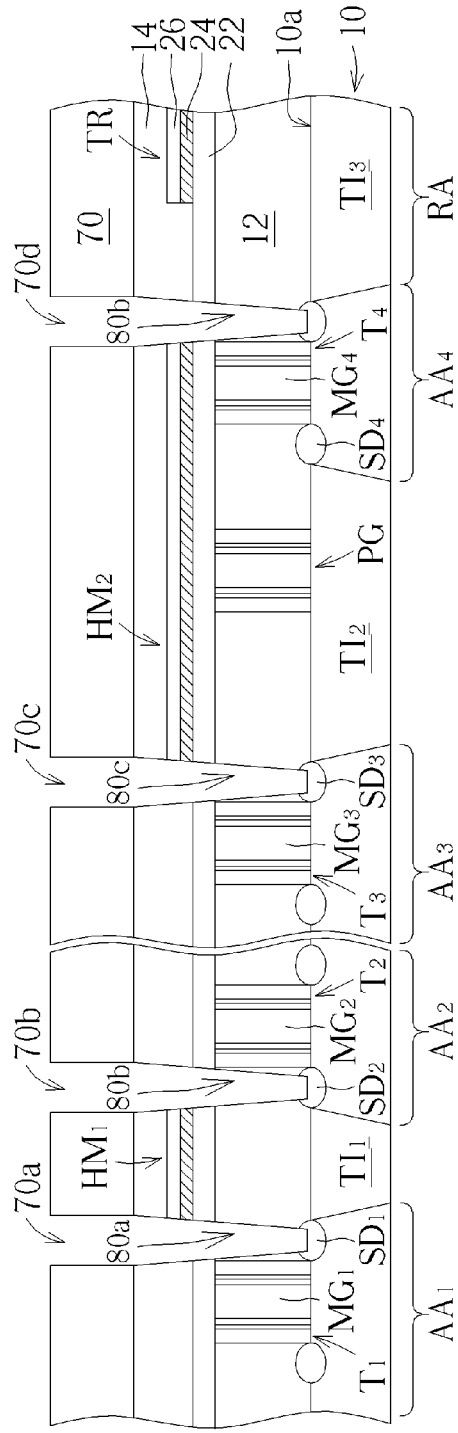

Next, as shown in FIG. 13, a photoresist pattern 70 having openings 70a to 70d is formed on the second interlayer dielectric layer 14, wherein the opening 70a is aligned with the source/drain region $SD_1$ of the transistor $T_1$, the opening 70b is aligned with the source/drain region $SD_2$ of the transistor $T_2$, the opening 70c is aligned with the source/drain region $SD_3$ of the transistor $T_3$, and the opening 70d is aligned with the source/drain region $SD_4$ of the transistor $T_4$.

An anisotropic dry etching process is performed by using the photoresist pattern 70 and the hard mask patterns $HM_1$ to $HM_2$ together as an etching resist mask to etch down the second interlayer dielectric layer 14, dielectric buffer layer 22 and the first interlayer dielectric layer 12 through the openings 70a to 70d, thereby forming contact openings 80a to 80d. The contact opening 80a exposes the source/drain region $SD_1$ of the transistor $T_1$, the contact opening 80b exposes the source/drain region $SD_2$ of the transistor $T_2$, the contact opening 80c exposes the source/drain region SD of the transistor $T_3$, and the contact opening 80d exposes the source/drain region $SD_4$ of the transistor $T_4$. Subsequently, the photoresist layer 70 is removed.

Figure 14:
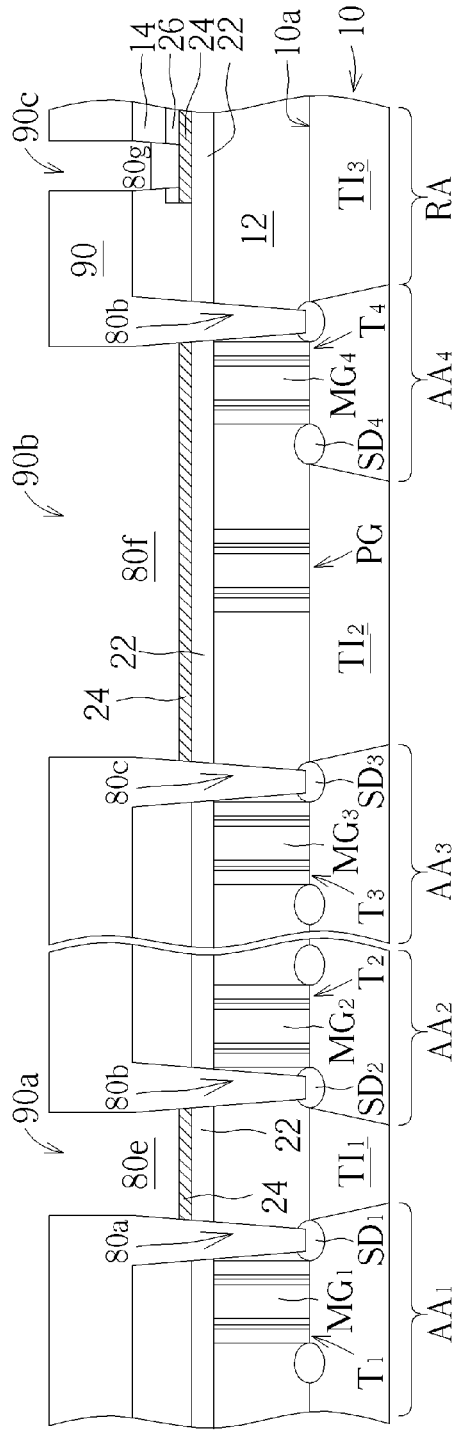

As shown in FIG. 14, a photoresist pattern 90 having openings 90a to 90c is then formed on the substrate 10. The opening 90a is located directly above the hard mask pattern $HM_1$ and the trench isolation region $TI_1$, the opening 90b is located directly above the hard mask pattern $HM_2$, and the opening 90c is located directly above the thin film resistor TR. Then, an anisotropic dry etching process is performed to etch down the second interlayer dielectric layer 14 and the capping layer 26 through the openings 90a to 90c, thereby forming a connecting opening 80e that can communicate with the contact openings 80a and 80b, forming a connecting opening 80f that can communicate with the contact openings 80c and 80d, and forming a resistor contact opening 80g. The resistor contact opening 80g exposes a terminal of the thin film resistor TR. According to the embodiment of the invention, the connecting opening 80e exposes the resistor material layer 24 of the hard mask pattern $HM_1$ and the connecting opening 80f exposes the resistor material layer 24 of the hard mask pattern $HM_2$.

According to the embodiment of the present invention, the resistor contact opening 80g may be formed by using another photo mask and a separate etching step. The resistor contact opening 80g does not penetrate through the resistor material layer 24. Subsequently, the photoresist pattern 90 is removed.

Figure 15:
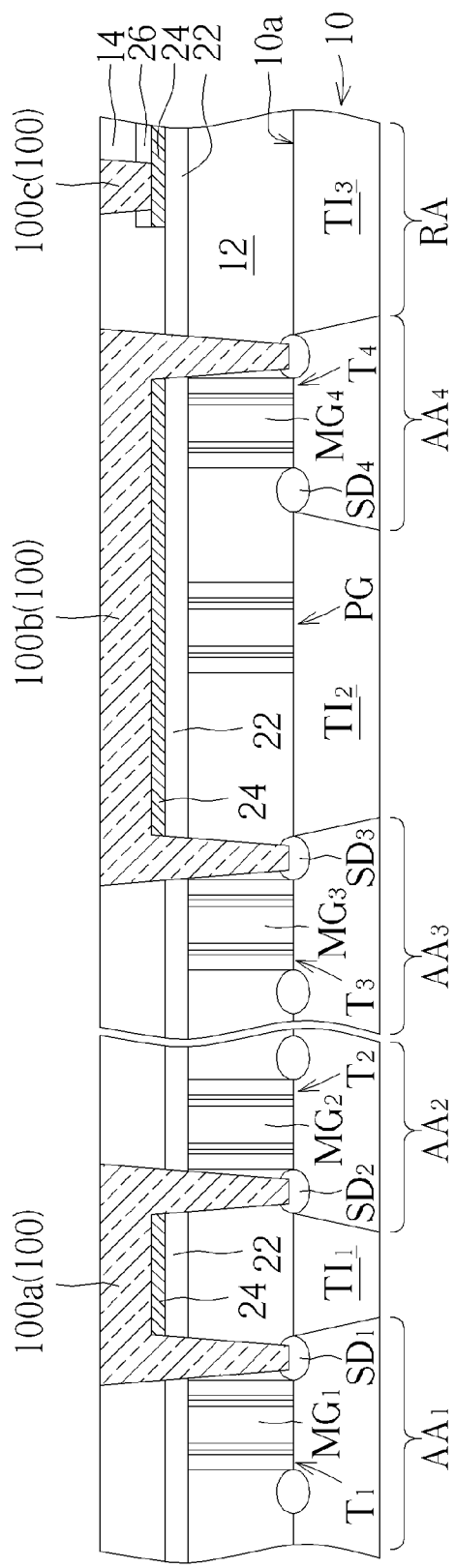

As shown in FIG. 15, a conductive material layer 100, such as titanium nitride or tungsten, is deposited into the resistor contact opening 80g, the contact openings 80a to 80d, and the connecting openings 80e and 80f. Next, a chemical mechanical polishing (CMP) process is performed to remove the conductive material layer 100 from the top surface of the second interlayer dielectric layer 14, thereby forming a resistor contact 100c in the resistor contact opening 80g, a local interconnect contact 100a in the contact openings 80a and 80b and the connecting opening 80e, and a local interconnect contact 100b in the contact openings 80c and 80d and the connecting opening 80f. According to the embodiment of the present invention, the local interconnect contact 100a is in direct contact with the resistor material layer 24 of the hard mask pattern $HM_1$, and the local interconnect contact 100b is in direct contact with the resistor material layer 24 of the hard mask pattern $HM_2$.

According to the embodiment of the present invention, the local interconnect contact 100a traverses the trench isolation region $TI_1$ and is in direct contact with the resistor material layer 24 of the hard mask pattern $HM_1$. The local interconnect contact 100b traverses the trench isolation region $TI_2$ and is in direct contact with the resistor material layer 24 of the hard mask pattern $HM_2$.

Figure 16:
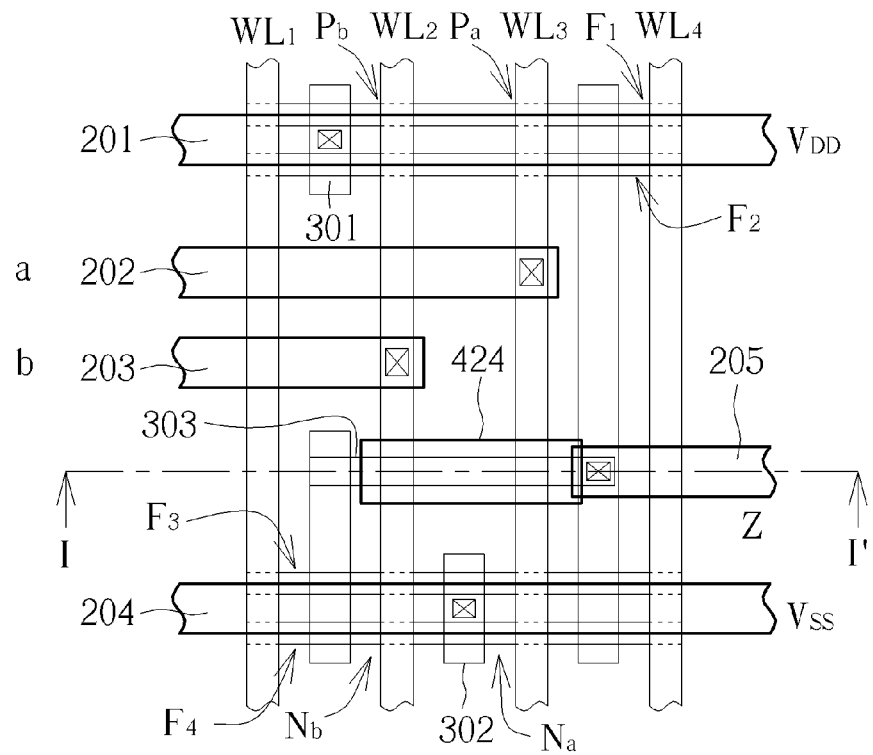
Figure 17:
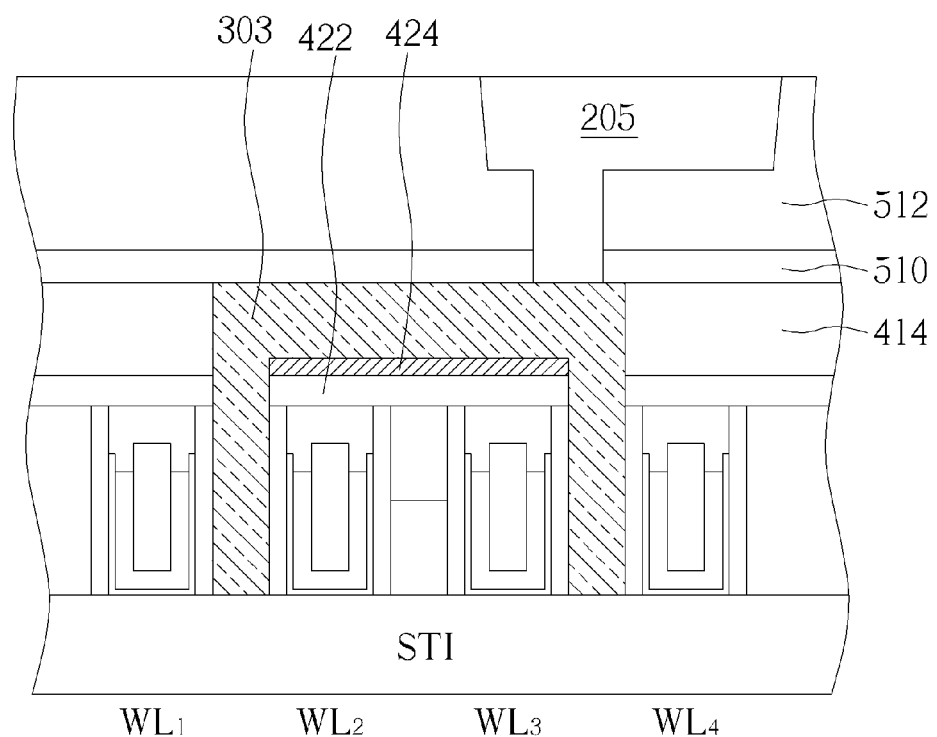

FIG. 16 is a schematic showing a layout of a two-input NOR gate circuit, wherein the local interconnect contact 100b in FIG. 15 is applied. FIG. 17 is a schematic diagram showing a cross-section along the tangent I-I' in FIG. 16.

As shown in FIG. 16, the two-input NOR gate circuit includes a plurality of gates $WL_1$ to $WL_4$ which are interleaved with the fin structures $F_1$ to $F_4$ to form a plurality of transistors such as NMOS transistors $N_a$ and $N_b$ and PMOS transistors $P_a$ and $P_b$. The corresponding signals can be provided through the metal layer patterns 201 to 205. For example, the signal at the input point a is coupled to the gate $WL_3$ through the metal layer pattern 202, and the signal at the input point b is coupled to the gate $WL_2$ through the metal layer pattern 203, and signal $V_{DD}$ is coupled to a terminal of the PMOS transistor $P_b$ through the metal layer pattern 201 and a contact structure 301, and signal $V_{ss}$ is coupled to a terminal shared by the NMOS transistors $N_a$ and $N_b$ through the metal layer pattern 204 and a contact structure 302, and the Z output point is coupled to a terminal of the NMOS transistor $N_b$ through the metal layer pattern 205 and the local interconnect contact 303.

As shown in FIG. 17, the local interconnect contact 303 traverses two gates $WL_2$ and $WL_3$, which is similar to the local interconnect contact 100b in FIG. 15, and the local interconnect contact 303 is in direct contact with the resistor material layer 24 traversing two gates $WL_2$ and $WL_3$. After the local interconnect contact 303 is completed, a dielectric layer 510 may be deposited, such as nitrogen-doped carbide (NDC), and an intermetal dielectric layer 512. Then, a metal layer pattern 205 is formed in the intermetal dielectric layer 512 and the dielectric layer 510, for electrical connection to the local interconnect contact 303.

Figure 18:
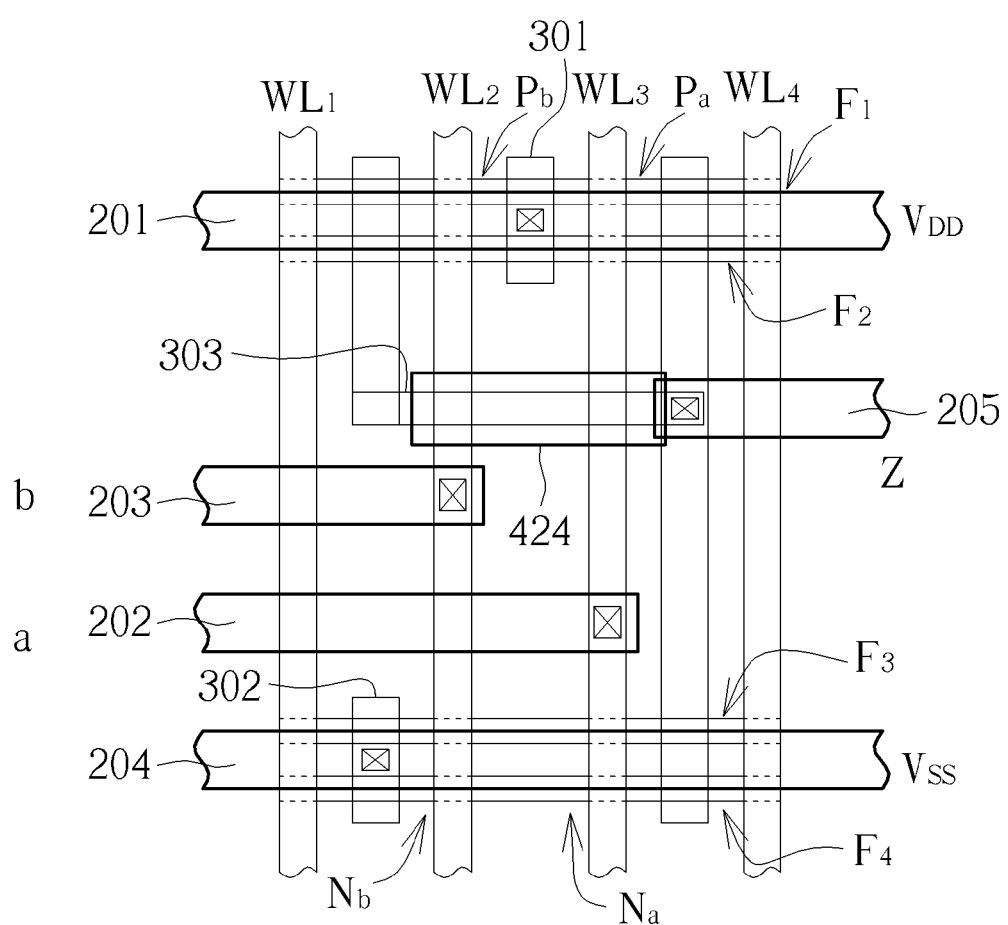

FIG. 18 is a schematic showing a layout diagram of a two-input NAND gate circuit in which the local interconnect contact 100b in FIG. 15 is applied. The same regions and elements are represented by the same numerals.

As shown in FIG. 18, the two-input NAND gate circuit includes a plurality of gates $WL_1$ to $WL_4$ which are interleaved with the fin structures $F_1$ to $F_4$ to form a plurality of transistors such as NMOS transistors $N_a$ and $N_b$ and PMOS transistors $P_a$ and $P_b$. The corresponding signal can be provided through the metal layer patterns 201 to 205. For example, the signal at the input point a is coupled to the gate $WL_3$ through the metal layer pattern 202, and the signal at the input point b is coupled to the gate $WL_2$ through the metal layer pattern 203. Signal $V_{DD}$ is coupled to a terminal shared by the PMOS transistors $P_a$ and $P_b$ through the metal layer pattern 201 and a contact structure 301, signal $V_{ss}$ is coupled to a terminal of the NMOS transistor $N_b$ through the metal layer pattern 204 and a contact structure 302, and the output point Z is coupled to a terminal of the PMOS transistor $P_a$ and a terminal of the PMOS transistor $P_b$ through the metal layer pattern 205 and the local interconnect contact 303.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a first transistor in a first region, a second transistor in a second region, a trench isolation region isolating the first region from the second region, a resistor-forming region, and a first interlayer dielectric (ILD) layer over the first region, the second region, and the resistor-forming region, wherein the first transistor comprises a first terminal selected from the group consisting of a first gate and a first source/drain region, and the second transistor comprises a second terminal selected from the group consisting of a second gate and a second source/drain region;
   forming a resistor material layer and a capping layer over the first region, the second region, and the resistor-forming region;
   patterning the capping layer and the resistor material layer to thereby form a first hard mask pattern above the first and second regions and a second hard mask pattern above the resistor-forming region;
   isotropically etching the resistor material layer;
   depositing a second interlayer dielectric (ILD) layer over the substrate; and
   patterning the second ILD layer and the first ILD layer with a mask and the first hard mask pattern to form a contact opening, wherein the contact opening exposes the first terminal, the second terminal, and the trench isolation region.

2. The method for fabricating semiconductor device according to claim 1 further comprising:
   forming a dielectric buffer layer between the resistor material layer and the first ILD layer.

3. The method for fabricating semiconductor device according to claim 2, wherein patterning the second ILD layer and the first ILD layer with the mask and the first hard mask pattern to form the contact opening comprises:
   etching through the second ILD layer, the dielectric buffer layer, and the first ILD layer not covered by the mask and the first hard mask pattern to thereby form the contact opening.

4. The method for fabricating semiconductor device according to claim 1, wherein after isotropically etching the resistor material layer, a thin film resistor is formed on the first ILD layer.

5. The method for fabricating semiconductor device according to claim 4 further comprising:
   etching through the second ILD layer and the second hard mask pattern to form a resistor contact opening that exposes a terminal of the thin film resistor.

6. The method for fabricating semiconductor device according to claim 5, wherein after forming the resistor contact opening, the method further comprises:
   depositing a conductive material layer into the resistor contact opening and the contact opening; and
   performing a chemical mechanical polishing (CMP) process to remove the conductive material layer outside the resistor contact opening and the contact opening, thereby forming a resistor contact in the resistor contact opening and a local interconnect contact in the contact opening.

7. The method for fabricating semiconductor device according to claim 5, wherein the resistor contact opening does not penetrate through the resistor material layer.

8. The method for fabricating semiconductor device according to claim 1, wherein the resistor material layer comprises titanium nitride, tantalum nitride, chromium silicide, or nickel-chromium alloys.

9. The method for fabricating semiconductor device according to claim 1, wherein the capping layer comprises silicon nitride.

10. A method for fabricating semiconductor device, comprising:
    providing a substrate having a first transistor in a first region, a second transistor in a second region, a trench isolation region isolating the first region from the second region, a resistor-forming region, and a first interlayer dielectric (ILD) layer over the first region, the second region, and the resistor-forming region, wherein the first transistor comprises a first terminal selected from the group consisting of a first gate and a first source/drain region, and the second transistor comprises a second terminal selected from the group consisting of a second gate and a second source/drain region;
    forming a resistor material layer and a capping layer over the first region, the second region, and the resistor-forming region;
    patterning the capping layer and the resistor material layer to thereby form a hard mask pattern above the trench isolation region and a thin film resistor above the resistor-forming region;
    depositing a second interlayer dielectric (ILD) layer on the hard mask pattern and the thin film resistor; and
    patterning the second ILD layer and the first ILD layer with a mask and the hard mask pattern to form a first contact opening and a second contact opening, wherein the first contact opening exposes the first source/drain region, and the second contact opening exposes the second source/drain region.

11. The method for fabricating semiconductor device according to claim 10 further comprising:
    forming a dielectric buffer layer between the resistor material layer and the first ILD layer.

12. The method for fabricating semiconductor device according to claim 11, wherein patterning the second ILD layer and the first ILD layer with the mask and the hard mask pattern to form the first contact opening and the second contact opening comprises:
    etching through the second ILD layer, the dielectric buffer layer, and the first ILD layer not covered by the mask and the hard mask pattern.

13. The method for fabricating semiconductor device according to claim 12 further comprising:
  removing the second ILD layer from directly above the hard mask pattern to form a connecting opening that communicates with the first and second contact openings.

14. The method for fabricating semiconductor device according to claim 13 further comprising:
  etching through the second ILD layer and the capping layer to form a resistor contact opening that exposes a terminal of the thin film resistor.

15. The method for fabricating semiconductor device according to claim 14, wherein after forming the resistor contact opening, the method further comprises:
  depositing a conductive material layer into the resistor contact opening, the first contact opening, the second contact opening, and the connecting opening; and
  performing a chemical mechanical polishing (CMP) process to remove the conductive material layer above a top surface of the second ILD layer, thereby forming a resistor contact in the resistor contact opening, a local interconnect contact in the first contact opening, the second contact opening, and the connecting opening.

16. The method for fabricating semiconductor device according to claim 15, wherein the dielectric buffer layer is in direct contact with the first gate and the second gate, the resistor material layer is in direct contact with the dielectric buffer layer, and the capping layer is in direct contact with the resistor material layer.

17. The method for fabricating semiconductor device according to claim 15, wherein the local interconnect contact is in direct contact with the resistor material layer in the hard mask pattern.

18. A semiconductor device, comprising:
  a substrate having a first transistor in a first region, a second transistor in a second region, a trench isolation region isolating the first region from the second region, and a resistor-forming region, wherein the first transistor comprises a first terminal selected from the group consisting of a first gate and a first source/drain region, and the second transistor comprises a second terminal selected from the group consisting of a second gate and a second source/drain region;
  a first interlayer dielectric (ILD) layer over the first region, the second region, and the resistor-forming region;
  a thin film resistor over the resistor-forming region, the thin film resistor comprising a resistor material layer and a capping layer on the resistor material layer;
  a hard mask pattern over the first region and the second region, the hard mask layer comprising the resistor material layer;
  a second interlayer dielectric (ILD) layer covering the hard mask pattern, the thin film resistor, and the first ILD layer;
  a contact opening penetrating through the second ILD layer, the capping layer, the resistor material layer, and the first ILD layer, thereby exposing the first terminal and/or the second terminal; and
  a local interconnect contact disposed in the contact opening.

19. The semiconductor device according to claim 18 further comprising a dielectric buffer layer between the resistor material layer and the first ILD layer.

20. The semiconductor device according to claim 18, wherein the resistor material layer comprises titanium nitride, tantalum nitride, chromium silicide, or nickel-chromium alloys.

21. The semiconductor device according to claim 18, wherein the capping layer comprises silicon nitride.

* * * * *